United States Patent

Kruppa et al.

[11] Patent Number: 6,081,996
[45] Date of Patent: Jul. 4, 2000

[54] THROUGH HOLE CIRCUIT BOARD INTERCONNECT

[75] Inventors: Victor David Kruppa, Tucson, Ariz.; Maurice Lydell Dantzler, Carmel, Ind.; Robert Ray Voltenburg, Jr., Davison, Mich.

[73] Assignee: Delco Electronics Corporation, Kokomo, Ind.

[21] Appl. No.: 09/177,586

[22] Filed: Oct. 23, 1998

[51] Int. Cl.⁷ ............... H05K 3/34; H05K 3/38; H01R 9/00
[52] U.S. Cl. ............... 29/840; 29/834; 29/837; 29/843; 439/82; 439/83
[58] Field of Search ............... 29/842–845, 837, 29/839, 834, 836, 840; 174/267–261, 262–264, 265; 361/774, 777; 439/82, 83

[56] References Cited

U.S. PATENT DOCUMENTS

| | | | |
|---|---|---|---|
| 4,592,137 | 6/1986 | Tanaka et al. | 29/843 |
| 5,637,835 | 6/1997 | Matern | 174/266 |
| 5,909,011 | 6/1999 | Chartrand et al. | 174/261 |

FOREIGN PATENT DOCUMENTS

| | | |
|---|---|---|
| 31 34 135 | 3/1983 | Germany. |
| 1 397 026 | 6/1975 | United Kingdom. |

OTHER PUBLICATIONS

IBM Techincal Disclosure Bullentin, vol. 8, No. 11, "Module Terminal Pin and Land Structure", J.A. Antenucci, Apr. 1966.

*Primary Examiner*—Lee Young
*Assistant Examiner*—Bobby Rushing, Jr.
*Attorney, Agent, or Firm*—Jimmy L. Funke

[57] ABSTRACT

In a preferred embodiment, a through hole connector pin for a circular through hole defined through a printed circuit board substrate, including: a vertical cylindrical portion of the connector pin for insertion in the circular through hole, the vertical cylindrical portion having a diameter less than that of the circular through hole; and a horizontal offset head portion of the connector pin formed integrally with the vertical cylindrical portion, the horizontal offset head portion having a shape approximating that of a conductive pad disposed on an upper surface of the printed circuit board substrate.

1 Claim, 2 Drawing Sheets

THROUGH HOLE CIRCUIT BOARD INTERCONNECT

BACKGROUND OF THE INVENTION

1. Field of the Invention

The present invention relates to circuit boards generally and, more particularly, but not by way of limitation, to novel through hole circuit board interconnect and method that provide a via having high current carrying capability and improved manufacturing technique.

2. Background Art

Circuit boards are widely used in a variety of electrical/electronic applications and typically include a relatively thin planar substrate of a dielectric material having at least on the bottom side thereof conductive traces and pads. Such conductive traces and pads may also be formed on the upper surface of the substrate. Means are provided for mounting electrical/electronic components to the upper surface of the substrate. Such means include having mounting pins extending through the substrate or by the use of solder paste which is subsequently melted. Electrical/electronic components may also similarly be mounted to the lower surface of the substrate.

To conductively connect the opposite sides of the circuit board, vias are provided at selected locations when the board is manufactured. The vias are subsequently filled with a conductive material to effect electrical connections between the upper and lower surfaces. Then, the board is wave soldered in a conventional apparatus to electrically connect various elements on the lower surface of the board.

In an early technique, a conductive cylinder of a metallic material was formed around the walls of the vias using electroplating processes. Such technique, while providing relatively satisfactory connections, was expensive. In a further development, a conductive silver-epoxy material may be used to fill the vias. This technique is much less expensive than electroplating, but the silver-epoxy materials is limited in current carrying capacity to a continuous rating of about 300 mA maximum, whereas, in some applications, it would be desirable to provide much higher current ratings. Multiple parallel vias can be employed; however, limitations exist due to the amount of substrate space consumed to connect multiple vias in parallel, and the inability to guarantee even current sharing between the parallel connected vias because of via-to-via impedance variation.

In yet another development, solid pins are inserted into the vias to provide conductive connections. While not having the limited current rating of silver-epoxy filled vias, the pins require a separate process step, are not easily grasped, and cannot be used in the surface mounting tape for pick and place machines.

A further disadvantage of conventional circuit board manufacturing processes is that during the wave soldering step, gasses generated by the solder flux during heating can cause blowholes to be created in the wave soldered joints.

Accordingly, it is a principal object of the present invention to provide a through hole circuit board interconnect that has a relatively high continuous current rating.

It is a further object of the invention to provide a method of manufacture of such a through hole circuit board interconnect that avoids formation of blowholes during the wave soldering step.

It is an additional object of the invention to provide such through hole circuit board interconnect and method of manufacture that can easily be used in surface mount placement machines.

It is another object of the invention to provide such through hole circuit board interconnect and method of manufacture that are economical.

It is yet a further object of the invention to provide such through hole circuit board interconnect and method of manufacture that employ existing printed circuit board assembly processes and equipment.

It is yet an additional object of the invention to provide such through hole circuit board interconnect that consumes a minimum amount of space, preferably close to the size of a via.

It is yet another object of the invention to provide such a method of manufacture that inherently creates a vent path for gases formed during wave soldering.

Other objects of the present invention, as well as particular features, elements, and advantages thereof, will be elucidated in, or be apparent from, the following description and the accompanying drawing figures.

SUMMARY OF THE INVENTION

The present invention achieves the above objects, among others, by providing, in a preferred embodiment, a through hole connector pin for a circular via defined through a printed circuit board substrate, comprising: a vertical cylindrical portion of said connector pin for insertion in said circular via, said vertical cylindrical portion having a diameter less than that of said circular via; and a horizontal offset head portion of said connector pin formed integrally with said vertical cylindrical portion, said horizontal offset head portion having a shape approximating that of a conductive pad disposed on an upper surface of said printed circuit board substrate.

BRIEF DESCRIPTION OF THE DRAWING

Understanding of the present invention and the various aspects thereof will be facilitated by reference to the accompanying drawing figures, provided for purposes of illustration only and not intended to define the scope of the invention, on which.

DETAILED DESCRIPTION OF THE PREFERRED EMBODIMENTS

Figure 1A:
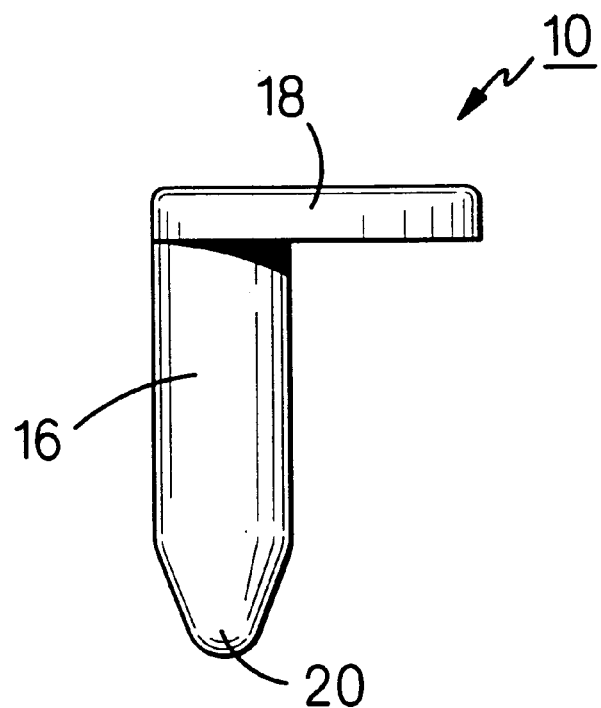
FIGS. 1(A) and 1(B) are enlarged side elevational and top plan views, respectively, of a through hole connector constructed according to the present invention.

Reference should now be made to the drawing figures on which similar or identical elements are given consistent identifying numerals throughout the various figures thereof, and on which parenthetical references to figure numbers direct the reader to the view(s) on which the element(s) being described is (are) best seen, although the element(s) may be seen on other figures also.

Figure 1B:
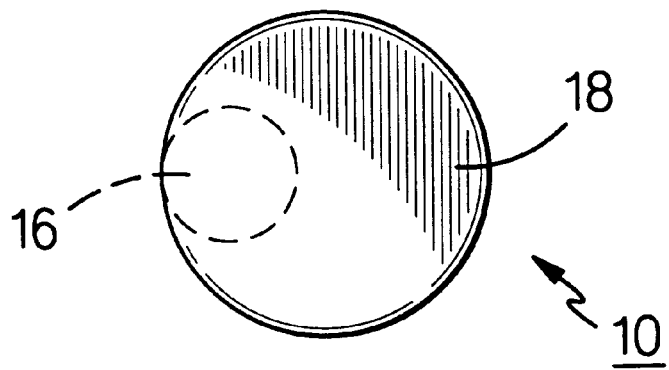

FIGS. 1(A) and 1(B) illustrate a through hole connector, constructed according to the present invention, and indicated generally by the reference numeral 10. Connector 10 includes a vertical cylindrical portion 16 and a horizontal offset head portion 18 formed integrally with the vertical cylindrical portion. While a wide range of dimensions may be employed depending on the application, for through hole interconnects in vias, vertical cylindrical portion 16 is preferably about 0.8 mm in diameter, with a length below horizontal offset head portion 18 of about 2.1 mm, and the horizontal offset head portion is about 2 mm in diameter, with a thickness of about 0.3 mm. Connector 10 is preferably electronic grade copper or brass, plated with tin/lead solder of 9 microns minimum thickness to optimize and erase electrical conductivity and solderability. Pointed tip 20 (FIG. 1(A)) is arbitrary but eases insertability. Such a connector 10 may be solid or hollow and can be conveniently packaged in 8 mm wide by 4 mm pitch tape and reel for use in a conventional pick and place machine.

Figure 2A:
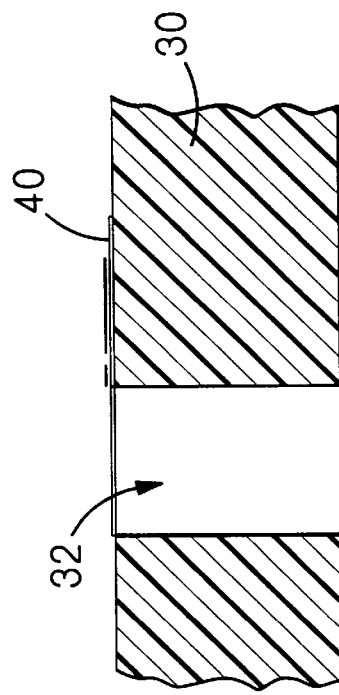
FIGS. 2(A)–2(D) are enlarged side elevational views showing the steps of the method of the present invention.

FIGS. 2(A)–2(D) illustrate the method of manufacture according to the present invention. Referring first to FIG. 2(A), a substrate 30 is provided which, for illustrative purposes, may be assumed to be the substrate for a printed circuit board and through which is defined a circular through hole 32. For use with connector pin 10, through hole 32 is preferably at least 5 mils greater in diameter than the diameter of vertical cylindrical portion 16. An annular conductive pad 36 is placed by conventional means on the lower surface of substrate 30 surrounding and adjacent through hole 32. Another conductive pad 40, asymmetrical with respect to hole 32 and surrounding the hole, is placed on the upper surface of substrate 30. The portion of conductive pad 40 offset with respect to hole 32 has the same general diameter as offset head 18 (FIG. 1(A)), but is slightly larger in diameter than the offset head. Then, a layer 44 of conventional solder paste is placed on the offset portion of conductive pad 40.

Figure 2B:
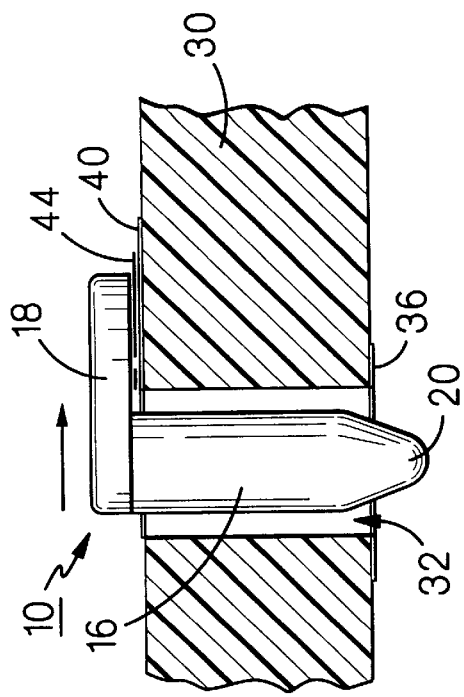
Figure 2C:
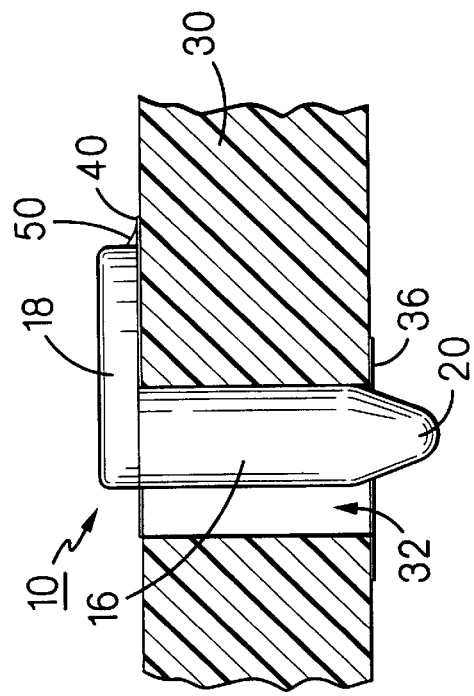

Then, as shown on FIG. 2(B), connector pin 10 is placed in through hole 32 in approximately coaxial relationship therewith. FIG. 2(C) illustrates the elements so far described after the elements have been processed in a conventional reflow step which melts the solder paste. By virtue of the surface tension of the molten solder, horizontal offset head portion 18 and, therefore, pin 10 have been drawn to the right as shown on FIG. 2(C) in the direction of the arrow, with vertical cylindrical portion drawn to the side of through hole 32, leaving open from the top to the bottom of substrate 30 a crescent shaped portion of the through hole. The melting step has also formed a solder fillet 50 around the edge of horizontal offset head portion 18 between the offset head portion and conductive pad 40.

Figure 2D:
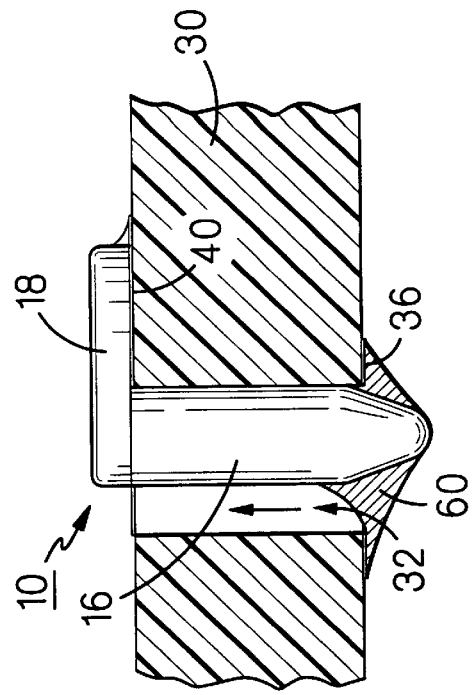

FIG. 2(D) illustrates the elements after a conventional wave soldering operation has been performed during which a solder fillet 60 has been formed connecting the lower end of connector pin 10 and conductive pad 36. During the wave soldering step, the open portion of through hole 32 permitted gas to escape in the direction of the arrow on FIG. 2(D), thus preventing the formation of blowholes in solder fillet 60.

Connector pin 10 can be conveniently and economically cold formed using conventional heading equipment such as that used for the manufacture of nails and plated using standard techniques. Horizontal offset head portion 18 (FIG. 1(A)) optimizes pickup and placement by conventional surface mount placement machines and to enable a large solder connection to maximize electronic contact, heat transfer, and surface tension. As described above, connector pin 10 is designed to carrying a continuous 5 Amperes of current.

No additional processing equipment is required over that of standard circuit board manufacturing processes.

In the embodiments of the present invention described above, it will be recognized that individual elements and/or features thereof are not necessarily limited to a particular embodiment but, where applicable, are interchangeable and can be used in any selected embodiment even though such may not be specifically shown.

Terms such as "upper", "lower", "inner", "outer", "inwardly", "outwardly", and the like, when used herein, refer to the positions of the respective elements shown on the accompanying drawing figures and the present invention is not necessarily limited to such positions.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

The embodiments of the invention in which an exclusive property or privilege is claimed are defined as follows:

1. A method of forming an electrical connection in a circular through hole defined through a printed circuit board substrate, comprising:

(a) providing a vertical cylindrical portion of a connector pin for insertion in said circular through hole, said vertical cylindrical portion having a diameter less than that of said circular through hole;

(b) providing a horizontal offset head portion of said connector pin formed integrally with said vertical cylindrical portion, said horizontal offset head portion having a shape approximating that of a first conductive pad disposed on an upper surface of said printed circuit board substrate adjacent said circular through hole;

(c) providing an annular second conductive pad on a lower surface of said printed circuit board substrate adjacent to and surrounding said circular through hole;

(d) then, placing a layer of a conductive solder paste on said first conductive pad;

(e) then, placing said vertical cylindrical portion of said connector pin in said circular through hole, with said horizontal offset head portion disposed on said layer of solder paste;

(f) then, putting said printed circuit board substrate in a reflow process, wherein said solder paste melts and draws said horizontal offset head over said first conductive pad, thereby drawing said vertical cylindrical portion against a wall of said circular through hole and leaving an open vertical portion of said circular through hole; and (g) then, putting said printed circuit board substrate in a wave soldering process wherein said vertical cylindrical portion is soldered to said second conductive pad and, during said wave soldering process, gas is permitted to escape upwardly through said open vertical portion of said circular through hole so as to prevent formation of solder blowholes.

* * * * *